United States Patent [19]
Swanson

[11] Patent Number: 5,861,776
[45] Date of Patent: Jan. 19, 1999

[54] HIGH EFFICIENCY RF AMPLIFIER

[75] Inventor: Hilmer Irvin Swanson, Quincy, Ill.

[73] Assignee: Harris Corporation, Melbourne, Fla.

[21] Appl. No.: 885,375

[22] Filed: Jun. 30, 1997

[51] Int. Cl.$^6$ .................................................. H03F 3/68
[52] U.S. Cl. ................................. 330/124 R; 330/295
[58] Field of Search ............................. 330/124 R, 295; 332/149, 178, 179, 180, 181; 455/108

[56] References Cited

U.S. PATENT DOCUMENTS 4,580,111  4/1986  Swanson .
5,438,684  8/1995  Schwent et al. ................ 330/124 R X Primary Examiner—James B. Mullins
Attorney, Agent, or Firm—Tarolli, Sundheim, Covell, Tummino & Szabo

[57] ABSTRACT

An RF power amplifier system is provided including a plurality of the DC voltage sources of different magnitudes. An RF source provides an RF drive signal. N RF actuatable power amplifiers are provided. Each amplifier, when actuated, is connectable to a selected one of the voltage sources for providing an RF output signal amplified in accordance with the magnitude with the selected voltage source. One or more of the N RF power amplifiers are actuated in dependence upon the value of an input signal. One of the voltage sources is selectively connected to each of the actuated RF power amplifiers. The amplified RF output signals are additively combined to provide a combined RF output signal.

23 Claims, 4 Drawing Sheets

HIGH EFFICIENCY RF AMPLIFIER

BACKGROUND OF THE INVENTION

The present invention relates to RF power amplifiers and, more particularly, to such amplifiers suitable for use in broadcasting including radio and television.

DESCRIPTION OF THE PRIOR ART

The U.S. Patent to H. I. Swanson U.S. Pat. No. 4,580,111 discloses an amplitude modulator for use in broadcasting. The modulator serves to generate an amplitude modulated carrier signal by selectively turning ON and OFF a plurality of RF amplifiers in a digital manner to produce amplitude modulation. Each RF amplifier includes a plurality of switching transistors connected together in a H type bridge circuit. The switching transistors are driven by a RF source having constant amplitude and frequency. Each RF amplifier includes a plurality of switching transistors which switch a DC voltage source, such as a B+ voltage source, across a load to cause current to flow through the load in opposing directions at a frequency dependent on that of the RF source. Thus, the output signal from each power amplifier is a RF signal of a fixed frequency and of a fixed magnitude, based on that of the B+ voltage supply source. The number of RF power amplifiers that are turned ON is dependent upon the magnitude of the input signal. These RF output signals are applied to a combiner to provide a combined RF output signal having an amplitude which is modulated in accordance with the amplitude of the input signal.

The RF output signal from each RF amplifier in the Swanson patent supra, may be considered as a unit step of a fixed magnitude, dependent upon the value of the B+ voltage supply source. The number of unit steps that are combined to provide the RF output signal is dependent upon the number of RF power amplifiers that are turned ON and this, in turn, is dependent upon the magnitude of the input signal. In order to achieve higher resolution, a large number of RF power amplifiers may be employed. Alternatively, higher resolution may be obtained by employing fractional step power amplifiers. For example, a system is disclosed in Swanson, supra, employing 31 unit step RF power amplifiers and 4 fractional step power amplifiers. Each fractional step amplifier provides an output signal having an amplitude which is fraction of the amplitude of the unit step RF power amplifiers. The 4 fractional step amplifiers include ½, ¼, ⅛, and ¹⁄₁₆ unit step amplifiers (sometimes referred to as binary steps).

In the example presented above, the 31 unit steps and 4 fractional step require 35 RF amplifiers. To achieve greater resolution requires more RF power amplifiers. These amplifiers are costly.

The present invention is directed to increasing the resolution of a RF amplifier system as described thus far by employing at least two different DC voltage sources of different values. One example is a B+voltage supply source and a 0.5 B+ voltage supply source. Thus, each RF amplifier when turned ON provides a RF output signal of either a B+ value or a 0.5 B+ value, depending upon which voltage source has been selected for use with that RF amplifier. The result is that each amplifier can provide a full unit step signal or a partial step signal depending upon which DC voltage source is connected to the RF power amplifier.

SUMMARY OF THE INVENTION

In accordance with a first aspect of the present invention, an RF power amplifier system is provided having a plurality of DC voltage sources of different magnitudes. An RF source provides an RF drive signal. N RF actuatable power amplifiers are provided. Each amplifier, when actuated, is connectable to a selected one of the voltage sources for providing an RF output signal amplified in accordance with the magnitude with the selected voltage source. One or more of the N RF power amplifiers are actuated in dependence upon the value of an input signal. One of the voltage sources is connected to each of the actuated RF power amplifiers. The amplified RF output signals are additively combined to provide a combined RF output signal.

In accordance with the still further aspect of the present invention, an RF amplifier system is provided which includes a plurality of DC voltage sources of different magnitudes and an RF source providing an RF drive signal. N RF actuatable power amplifiers are provided with each, when actuated, providing an RF output signal amplified in accordance with the magnitude of one of the voltage sources. One or more of the N RF power amplifiers are actuated in dependence upon the value of an input signal. Control circuitry serves to selectively connect each actuated power amplifier with a selected one of the voltage sources so that each actuated power amplifier provides an output signal having a magnitude in dependence upon that of the selected DC voltage source. The amplified RF output signals are additively combined to provide a combined RF output signal.

In accordance with a still further aspect of the present invention, an RF amplifier system is provided which includes first and second DC voltage sources of different magnitudes and an RF source providing an RF drive signal. N RF power amplifiers are provided with each serving to provide an RF output signal amplified in accordance with the magnitude of one of the voltage sources. N first actuatable switches are provided with each, when actuated, connecting the first voltage source with an associated one of the N power amplifiers. N second actuatable switch means are provided with each, when actuated, connecting the second voltage source with an associated one of the N power amplifiers. Control circuitry is provided for actuating one of more of the N first switching means or one or more of the N second switching means in dependence upon the value of an applied input signal. The amplified RF output signals are additively combined to provide a combined RF output signal.

BRIEF DESCRIPTION OF THE DRAWINGS

The foregoing and other objects and advantages of the present invention will become more readily apparent from the following description as taken in conjunction with the accompanying drawings wherein.

DESCRIPTION OF PREFERRED EMBODIMENTS

One application of the present invention is in conjunction with RF power amplifiers employed in transmitters for radio broadcasting or television video signal broadcasting. An example of a transmitter for such application is presented in FIG. 1 and takes the form of a digital amplitude modulator 10 employing a plurality of RF power amplifiers A1 through AN.

Figure 1:
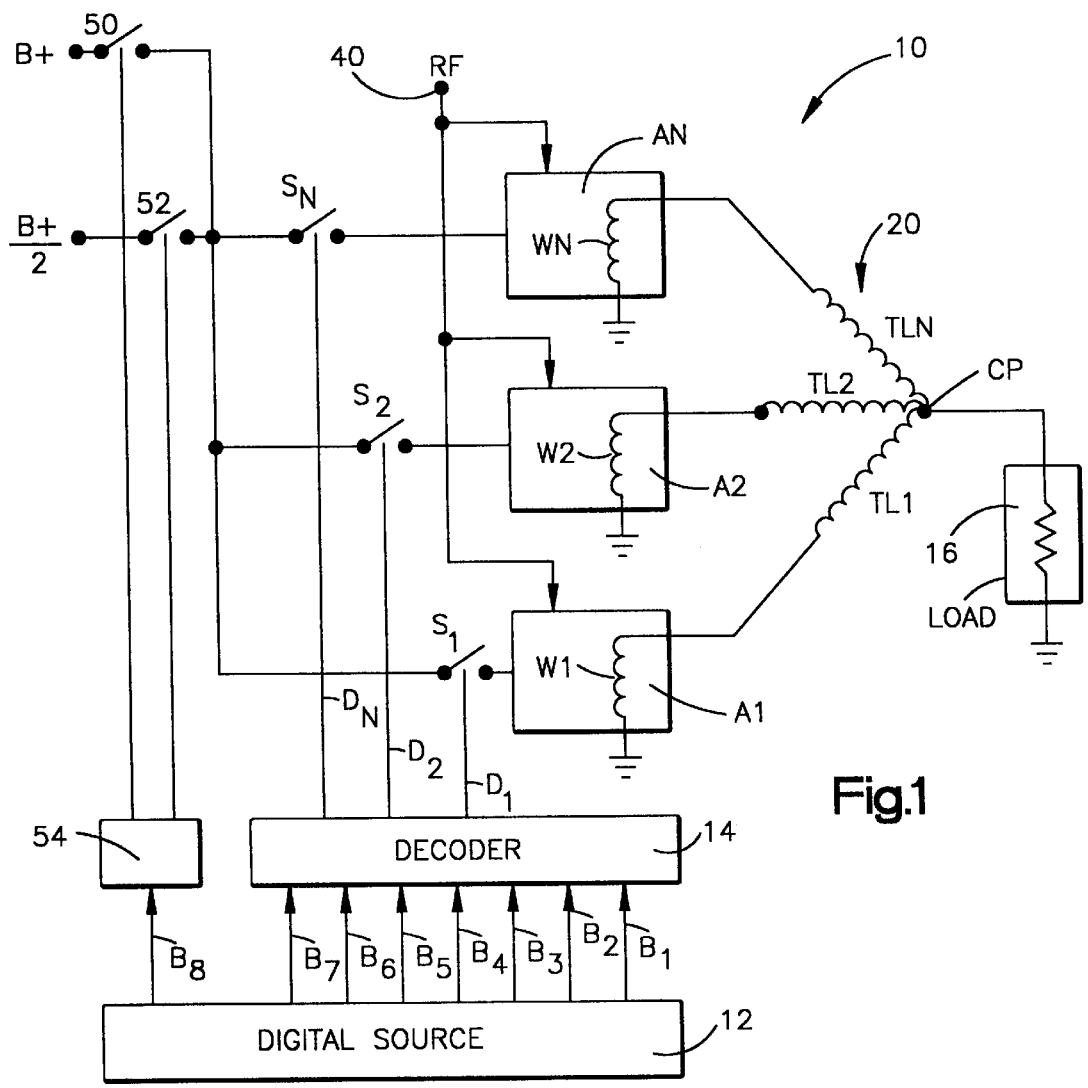
FIG. 1 is a schematic-block diagram illustration of one embodiment of the invention.

The amplitude modulator 10 illustrated in FIG. 1 receives an input signal, as from a source of analog signals. These signals may then be converted as by an analog to digital converter into a series of digital words serving as a digital source 12. These may be eight bit digital words. Each digital word represents a sample of a time varying analog signal, such as a typical audio or video signal. The digital words are decoded by a decoder 14 which provides output control signals D1–DN for controlling the operation of the RF amplifiers A1–AN to provide an amplitude modulated carrier signal on an output circuit leading to a load 16, which may include a RF transmitting antenna.

The control signals D1–DN provided by the decoder 14 are preferably binary signals, each having a binary 1 or a binary 0 level. The number of signals having a binary 1 or binary 0 level is dependent upon the level of the input signal provided by source 12. Each RF amplifier that is turned ON will provide an output signal having a frequency dependent on the RF carrier signal and an amplitude dependent upon the selected DC voltage. The output signals taken from amplifiers A1–AN are combined in a N-way combiner 20 and which includes transmission lines TL1–TLN. Each transmission line is a 90° transmission line, known in the art. These are connected together to a common point CP and the combined RF output signal is supplied to the load 16. The input ends of transmission lines TL1–TLN are connected to amplifier output windings W1–WN.

Figure 2:
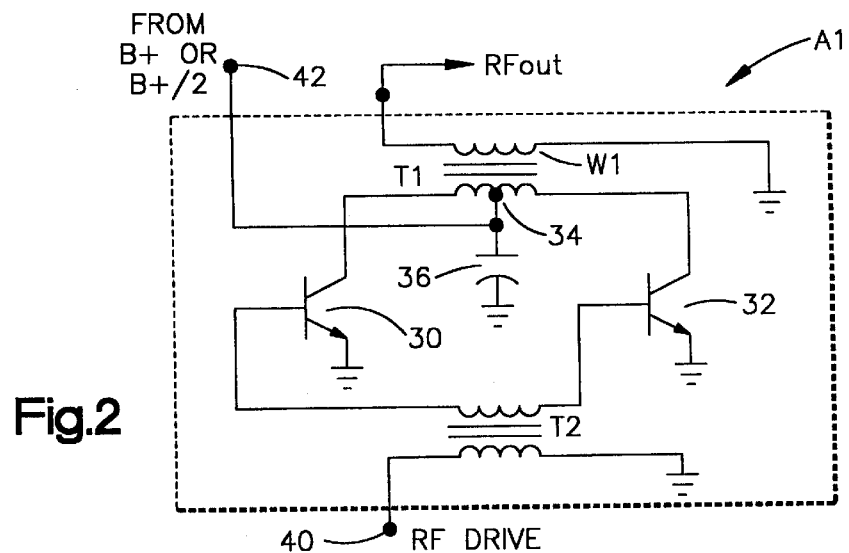
FIG. 2 is a schematic diagram illustrating the construction of one RF power amplifier employed in the embodiments of the invention herein.

The RF power amplifiers A1–AN may each take the form of a push-pull, single ended amplifier A1 illustrated in FIG. 2. This amplifier includes a pair of switching transistors, such as NPN transistors 30 and 32, having their emitters connected to ground and their collectors connected to opposite ends of a center tapped primary winding of a transformer T1 and which has an output winding W1. The center tap 34 on the primary winding of transformer T1 is connected to a DC voltage source, taking the form of either a B+ voltage source or a 0.5 B+ voltage source. The center tap is also connected by a way of a capacitor 36 to ground. An input transformer T2 receives a RF drive signal at a terminal 40. The secondary winding of this transformer is connected to the base electrodes of transistors 30 and 32 so that these transistors are turned ON and OFF at a frequency dependent upon that of the RF drive signal.

The RF drive signal may take the form of a RF carrier signal of a fixed magnitude and fixed frequency. During a first-half cycle, transistor 30 is turned ON and a DC signal from the DC voltage source is applied through the left half of winding 34 and, thence, through the collector to emitter of the transistor 30 to ground. This causes current to flow in a first direction through output winding W1. During the second-half of the cycle, transistor 30 is turned OFF and transistor 32 is turned ON. Current flows from the DC source through the right side of winding 34 and, thence, through the collector to emitter of transistor 32 to ground. This causes current to flow in the opposite or second direction through winding W1.

The frequency of this alternating current flow in winding W1 is dependent on the frequency of switching transistors 30 and 32 ON and OFF and this frequency is dependent upon that of the RF drive signal. The magnitude of the current flowing in winding W1 is dependent upon the magnitude of the DC voltage source connected to input terminal 42. As will be discussed hereinafter, if terminal 42 is connected to a B+ voltage supply source, then the RF output signal from terminal 44 will be considered as a full unit step signal. If the input terminal 42 of amplifier A1 is connected to the 0.5 B+ voltage source then the RF output signal obtained from the output terminal 44 will be considered as a partial step signal (as opposed to a full unit step signal).

In accordance with the present invention, each of the RF power amplifiers A1–AN, when actuated, may provide either a full unit step signal or a partial step signal to the N-way combiner 20. As a result, only N amplifiers are required to provide up to N full unit step signals or up to N partial step signals or a combination of up to a total of N unit step and partial step signals to the combiner. This reduces the cost and increases the efficiency of the RF amplifier system.

In accordance with one embodiment of the invention as shown in FIG. 1, the decoder 14 is an N-way decoder and, for example, may decode 7 bit digital words so that the decoder may control as many as 128 RF power amplifiers. The power amplifiers are actuated by closure of the associated switches S1 through SN. The number of these switches that are closed is dependent upon the magnitude of the signal represented by the 7 bit digital word. In this embodiment, an 8th bit, such as bit $B_8$, is used to select either a B+ voltage supply or a 0.5 B+ voltage supply so that the actuated power amplifiers will supply either a full unit step signal or a partial step signal. If bit $B_8$ is at a binary 0 level, then switch 50 is closed to supply a B+ DC voltage to each of the actuated power amplifiers. If bit $B_8$ is at a binary 1 level, then switch 52 is closed to supply a 0.5 B+ D.C. voltage to each of the actuated power amplifiers. This embodiment can selectively provide, for each digital word, as many as 128 unit step signals or as many as 128 partial step signals or a combination for a total of 128 unit step and partial step signals to the N-way combiner 20.

Figure 3:
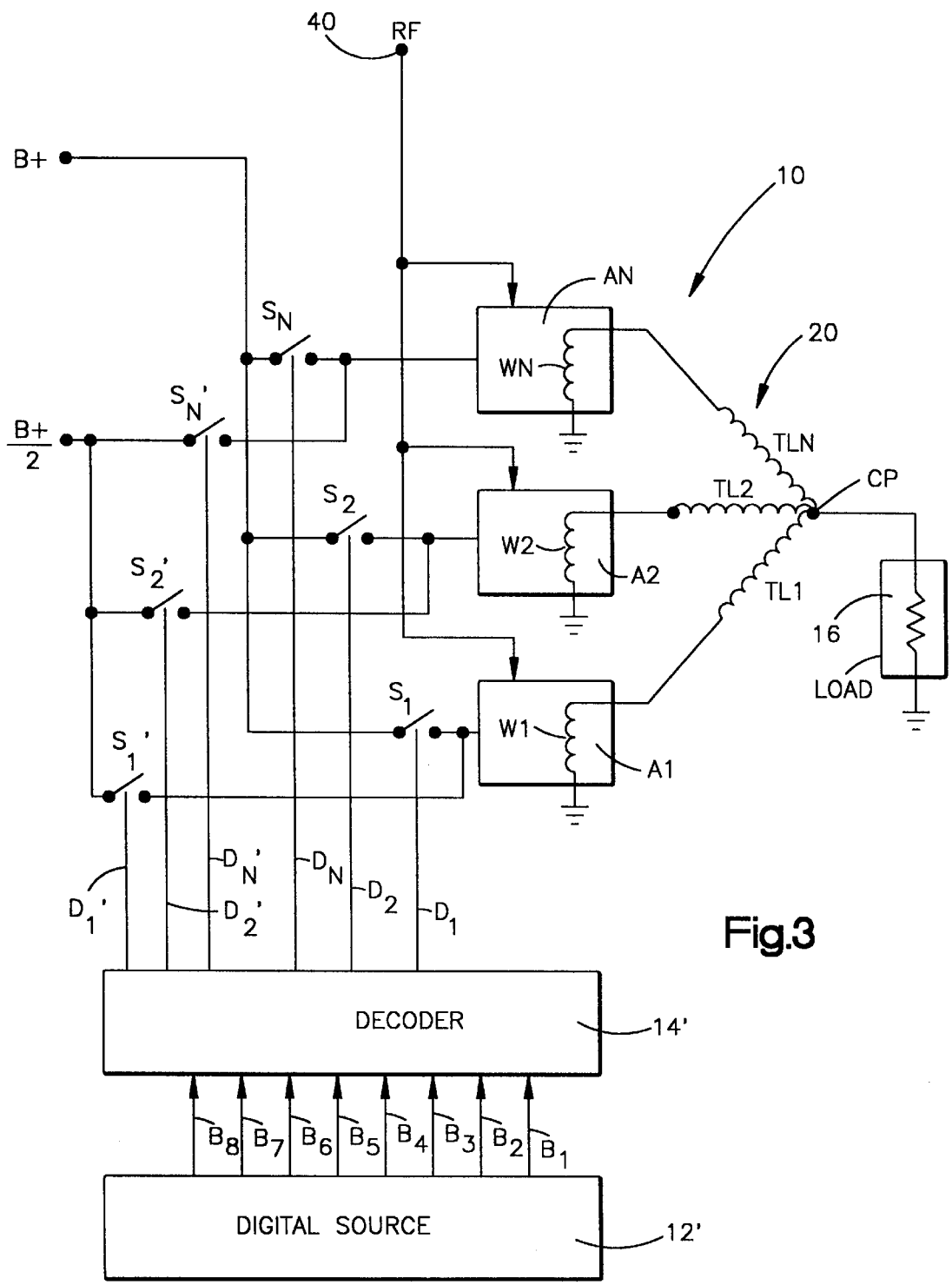
FIG. 3 is a schematic-block diagram illustration of a second embodiment of the invention.

Reference is now made to FIG. 3 which illustrates another embodiment of the invention. In the embodiment of FIG. 1, there are N RF amplifiers A1–AN together with N switches S1–SN with the switches being actuated by a respective one of N control signals D1–DN. If N is 128, then there are 128 switches S1–SN. In the embodiment of FIG. 1, only two switches 50 and 52 are employed for connecting each actuated RF amplifier with a B+ voltage supply source or a 0.5 B+ voltage supply source.

The embodiment of FIG. 3 is similar to that of the embodiment in FIG. 1 and accordingly like components are identified with like character references. Only the differences in the two embodiments are described below.

In the embodiment of FIG. 3 there are N switches S1–SN that may be actuated by the decoder 14' by means of N control signals D1–DN. These control signals may actuate one or more of the RF amplifiers in dependence upon the value of the digital word obtained from the digital source 12. In the embodiment of FIG. 3 a single decoder 14' is provided to receive all 8 bits of each digital word from source 12. Bit $B_8$ is reserved for indicating whether a step signal for the selected amplifier should be a full unit step (B+ level) or a partial step (0.5 B+). Decoder 14' provides two sets of control signals, each providing up to N control signals, including signals D1–DN and D1'–DN'. Control signals D1–DN serve to actuate one or more of the amplifiers A1–AN by closing selected combinations of the switches S1–SN to actuate selected combinations of the RF amplifiers. Each actuated amplifier is connected to a B+ voltage supply source. Similarly, control signals D1'–DN' control actuation of a selected combination of switches S1'–SN' to actuate a selected combination of the RF amplifiers with each actuated amplifier being connected to a 0.5 B+ voltage source. In this embodiment, bit $B_8$ determines which voltage source is to be employed. When bit $B_8$ is at a binary 1 level this is indicative that the B+ voltage source should be employed. When bit $B_8$ is at a binary 1 level this is indicative that the 0.5 B+ voltage source should be employed.

The embodiment of FIG. 3, like that of FIG. 1, permits each actuated RF amplifier to provide either a full unit step signal or a partial step signal. Each digital word includes 8 bits with 7 bits being employed to provide information as to the magnitude of the input signal. Any combination of up to 128 RF power amplifiers may be actuated. Bit $B_8$ determines which voltage source will be employed for each of the actuated RF amplifiers.

Figure 4:
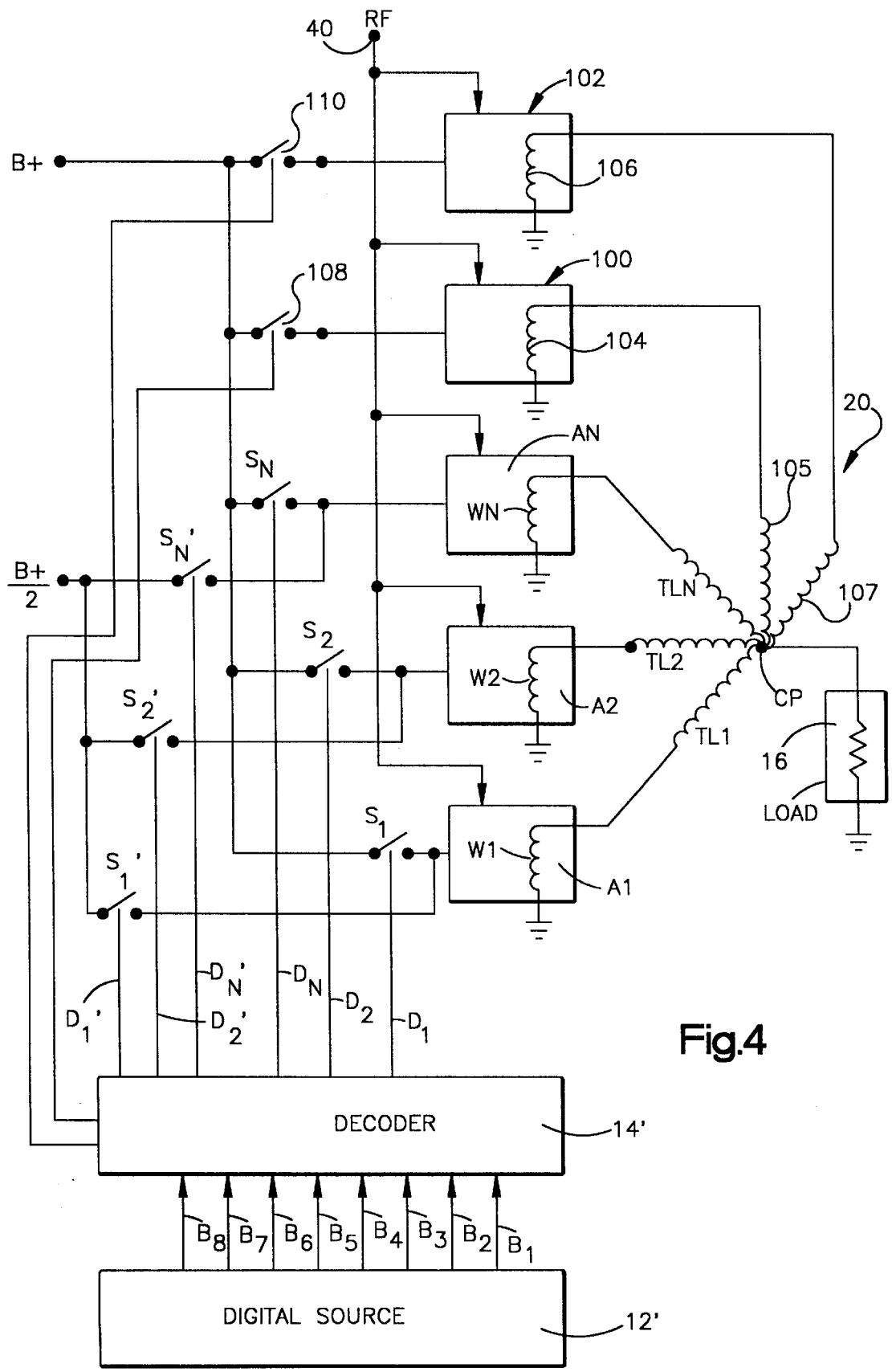
FIG. 4 is a schematic-block diagram illustration of third embodiment of this invention.

Reference is now made to FIG. 4 which illustrates another embodiment of the invention. This embodiment is similar to that as illustrated in FIG. 3 and only the differences will be described herein in detail.

The embodiment of FIG. 4 adds a pair of binary or fractional step amplifiers 100 and 102 each of which is constructed in a manner similar to amplifier A1 described in FIG. 2. The difference between these amplifiers 100 and 102 and that of FIG. 2 is in the winding turn ratio between the primary winding and the secondary winding of each output transformer in amplifiers 100 and 102. The secondary or output windings 104 and 106 have different numbers of turns so that amplifier 100 may provide a fractional output voltage such as ¼ B+ whereas amplifier 102 may provide a fractional voltage of ¾ B+. The output windings 104 and 106 are connected to the common point CP in combiner 20 by transmission lines 105 and 107. For each digital word decoded by decoder 14' the decoder, based on the value of the digital word, may actuate one or both of amplifiers 100 and 102 by closing switches 108 and 110. Whereas only two of these fractional amplifiers 100 and 102 have been illustrated, it is to be appreciated that additional fractional amplifiers may be added. These additional fractional amplifiers 100 and 102 provide increased resolution for each digital word decoded by decoder 14'.

Figure 5:
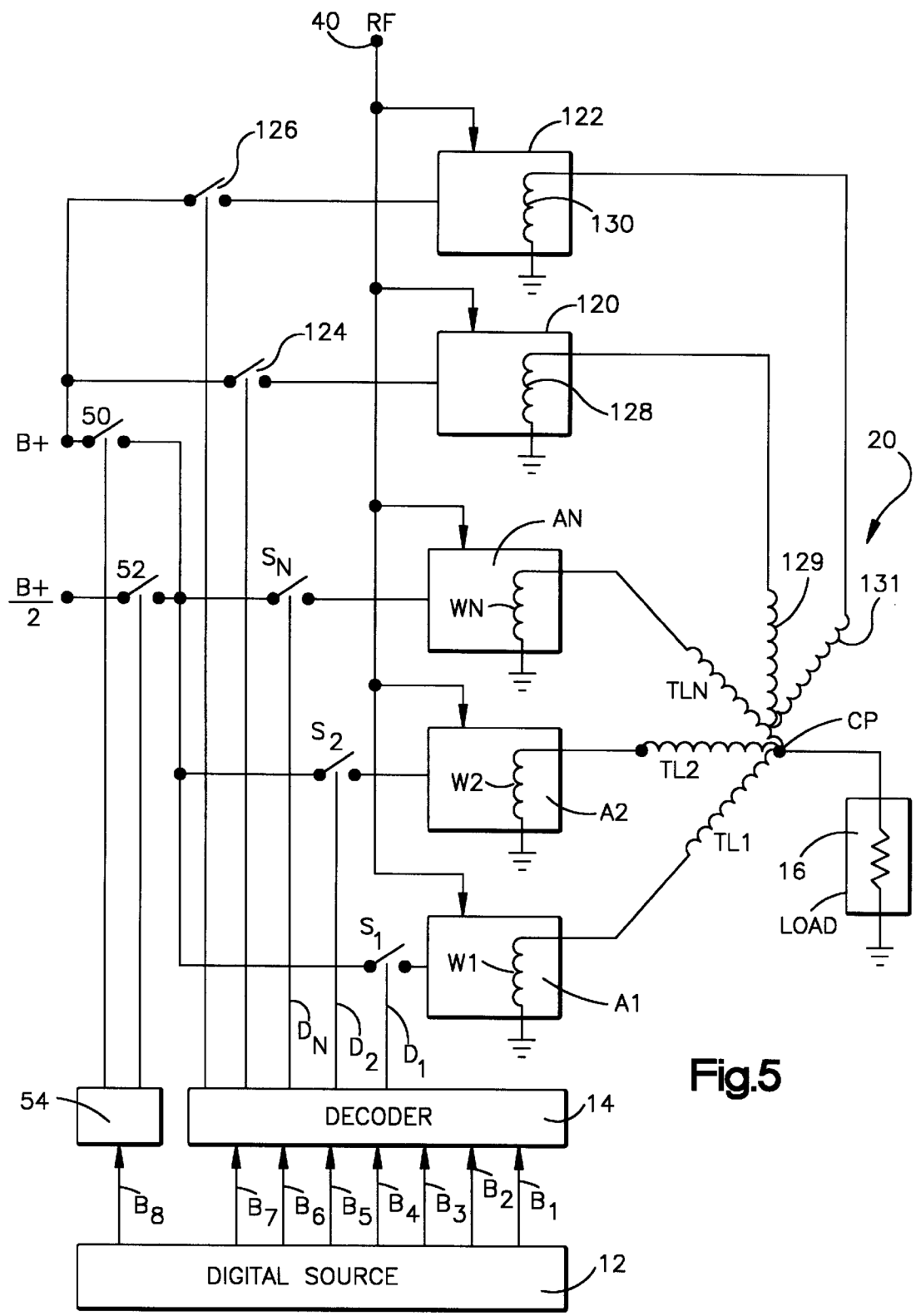
FIG. 5 is a schematic-block diagram illustration of a fourth embodiment of this invention.

Reference is now made to FIG. 5 which illustrates another embodiment of the invention. This embodiment is similar to that as illustrated in FIG. 1 and only the differences will be described herein in detail.

The embodiment of FIG. 5 adds a pair of binary or fractional step amplifiers 120 and 122 each of which is constructed in a manner similar to amplifier A1 described in FIG. 2. The difference between these amplifiers 120 and 122 and that of FIG. 2 is in the winding turn ratio between the primary winding and the secondary winding of each output transformer in amplifiers 120 and 122. The secondary or output windings 128 and 130 have different numbers of turns so that amplifier 120 may provide a fractional output voltage such as ¼ B+ whereas amplifier 122 may provide a fractional voltage of ¾ B+. The output windings 120 and 130 are connected to the common point CP in combiner 20 by transmission lines 129 and 131. For each digital word decoded by decoder 14' the decoder, based on the value of the digital word, may actuate one or both of amplifiers 120 and 122 by closing switches 124 and 126. Whereas only two of these fractional amplifiers 120 and 122 have been illustrated, it is to be appreciated that additional fractional amplifiers may be added. These additional fractional amplifiers 100 and 102 provide increased resolution for each digital word decoded by decoder 14.

The invention herein may be employed in an amplitude modulator for use in a radio broadcasting system with a wide range of frequencies and may also be employed in a television broadcast system. At high frequency, such as that for television broadcasting, the RF amplifiers may take the form of single-ended push pull amplifiers as illustrated herein in FIG. 2. In such case, the amplifiers are grounded and not floating as in the case of the amplifiers provided in the patent to Swanson U.S. Pat. No. 4,580,111. The combiner 20 need not employ reject resistors. For television purposes, the transmitter may be operated at a frequency including those for both UHF and VHF operations.

Although the invention has been described with respect to preferred embodiment, it is to be appreciated that various modifications may be made without departing from the spirit and scope of the invention as defined by the appended claims.

Having described the invention, I claim the following:

1. An RF amplifier system comprising:
   a plurality of DC voltage sources of different
   an RF source providing a RF drive signal;
   N RF actuatable power amplifiers each, when actuated, receiving and amplifying said RF drive signal and each connected to a selected one of said voltage sources for providing a RF output signal amplified in accordance with the magnitude of said selected voltage source and wherein N is at least two;
   means for providing an input signal;
   means for actuating one or more of said N RF power amplifiers in dependence upon the value of said input signal;
   means for selectively connecting one of said voltage sources to each actuated RF power amplifier; and,
   means for additively combining said amplified RF output signals to provide a combined RF output signal.

2. An RF amplifier system comprising:
   a plurality of DC voltage sources of different magnitudes;
   an RF source providing a RF drive signal;
   N RF actuatable power amplifiers each, when actuated, receiving and amplifying said RF drive signal and each connected to a selected one of said voltage sources for providing a RF output signal amplified in accordance with the magnitude of said selected voltage source and wherein N is at least two;
   means for providing an input signal;
   means for actuating one or more of said N RF power amplifiers in dependence upon the value of said input signal;
   means for selectively connecting one of said voltage sources to each actuated RF power amplifier;
   means for additively combining said amplified RF output signals to provide a combined RF output signal; and,
   wherein said means for providing an input signal includes means for providing a plurality of multi-bit digital words each representing a sample of a time varying analog signal.

3. A system as set forth in claim 2 wherein said means for actuating includes decoder means for decoding said digital words and, for each decoded digital word, providing control signals for controlling actuation of said power amplifiers.

4. A system as set forth in claim 2 wherein said actuating means includes decoder means having N first outputs for respectively providing up to N turn on control signals for actuating one or more of said actuatable amplifiers with the number of said turn on control signals being provided being dependent upon the value of said input signal.

5. An RF amplifier system comprising:

a plurality of DC voltage sources of different magnitudes;

an RF source providing a RF drive signal;

N RF actuatable power amplifiers each, when actuated, receiving and amplifying said RF drive signal and each connected to a selected one of said voltage sources for providing a RF output signal amplified in accordance with the magnitude of said selected voltage source and wherein N is at least two;

means for providing an input signal;

means for actuating one or more of said N RF power amplifiers in dependence upon the value of said input signal;

means for selectively connecting one of said voltage sources to each actuated RF power amplifier;

means for additively combining said amplified RF output signals to provide a combined RF output signal; and wherein said plurality of DC voltage sources includes a first voltage source and a second voltage source of different magnitudes, first actuatable switching means for connecting said first DC voltage source to each actuated RF power amplifier and second actuatable switching means for connecting said second DC voltage source to each actuated RF power amplifier.

6. A system as set forth in claim 5 wherein said means for providing an input signal includes means for providing a plurality of multi-bit digital words each representing a sample of a time varying analog signal.

7. A system as set forth in claim 6 wherein said means for actuating includes decoder means for decoding said digital words and, for each decoded digital word, providing control signals for controlling actuation of said power amplifiers.

8. A system as set forth in claim 6 wherein each said digital word includes a coded control portion having a first value for selecting said first DC voltage source and a second value for selecting said second DC voltage source and means responsive to said control portion for actuating said first switching means or said second switching means in dependence upon the value of said coded control portion.

9. A system as set forth in claim 8 including means for providing at least one fractional RF output signal having a magnitude which is a fraction of the magnitude of said first DC voltage source, said combining means being operative to additionally combine said amplified RF output signals with said at least one fractional output signal to provide said combined RF output signal.

10. An RF amplifier system comprising:

a plurality of DC voltage sources of different magnitudes;

a RF source providing a RF drive signal;

N RF actuatable power amplifiers each, when actuated, receiving and amplifying said RF drive signal and providing a RF output signal amplified in accordance with the magnitude of one of said voltage sources and wherein N is at least two;

means for providing an input signal;

means for actuating one or more said N RF power amplifiers in dependence upon the value of said input signal;

means for selectively connecting each said power amplifier with a selected one of said voltage sources so that each actuated RF power amplifier provides an output signal having a magnitude in dependence upon that of said selected DC voltage source; and means for additively combining said amplified RF output signals to provide a combined RF output signal.

11. An RF amplifier system comprising:

a plurality of DC voltage sources of different magnitudes;

a RF source providing a RF drive signal;

N RF actuatable power amplifiers each, when actuated, receiving and amplifying said RF drive signal and providing a RF output signal amplified in accordance with the magnitude of one of said voltage sources and wherein N is at least two;

means for providing an input signal;

means for actuating one or more said N RF power amplifiers in dependence upon the value of said input signal;

means for selectively connecting each said power amplifier with a selected one of said voltage sources so that each actuated RF power amplifier provides an output signal having a magnitude in dependence upon that of said selected DC voltage source;

means for additively combining said amplified RF output signals to provide a combined RF output signal; and, wherein said means for providing an input signal includes means for providing a plurality of multi-bit digital words each representing a sample of a time varying analog signal.

12. A system as set forth in claim 11 wherein said means for actuating includes decoder means for decoding said digital words and, for each decoded digital word, providing control signals for controlling actuation of said power amplifiers.

13. A system as set forth in claim 11 wherein said actuating means includes decoder means having N outputs for respectively providing up to N turn on control signals for actuating one or more of said actuatable amplifiers with the number of said turn on control signals being provided being dependent upon the value of said input signal.

14. An RF amplifier system comprising:

a plurality of DC voltage sources of different magnitudes;

a RF source providing a RF drive signal;

N RF actuatable power amplifiers each, when actuated, receiving and amplifying said RF drive signal and providing a RF output signal amplified in accordance with the magnitude of one of said voltage sources and wherein N is at least two;

means for providing an input signal;

means for actuating one or more said N RF power amplifiers in dependence upon the value of said input signal;

means for selectively connecting each said power amplifier with a selected one of said voltage sources so that each actuated RF power amplifier provides an output signal having a magnitude in dependence upon that of said selected DC voltage source; and means for additively combining said amplified RF output signals to provide a combined RF output signal; and, wherein said plurality of DC voltage sources includes a first voltage source and a second voltage source of different magnitudes, first actuatable switching means for connecting said first DC voltage source to each actuated RF power amplifier and second actuatable switching means for connecting said second DC voltage source to each actuated RF power amplifier.

15. An amplifier system as set forth in claim 14 wherein said means for providing an input signal includes means for providing a plurality of multi-bit digital words each representing a sample of a time varying analog signal.

16. A system as set forth in claim 15 wherein said means for actuating includes decoder means for decoding said digital words and, for each decoded digital word, providing control signals for controlling actuation of said power amplifiers.

17. A system as set forth in claim 15 wherein each said digital word includes a coded control portion having a first value for selecting said first DC voltage source and a second value for selecting said second DC voltage source and means responsive to said control portion for actuating said first switching means or said second switching means in dependence upon the value of said coded control portion.

18. A system as set forth in claim 17 including means for providing at least one fractional RF output signal having a magnitude which is a fraction of the magnitude of said first DC voltage source, said combining means being operative to additionally combine said amplified RF output signals with said at least one fractional output signal to provide said combined RF output signal.

19. An RF amplifier system comprising:

first and second DC voltage sources of different magnitudes;

a RF source providing a RF drive signal;

N RF power amplifiers each for receiving said RF drive signal and providing a RF power signal amplified in accordance with the magnitude of one of said voltage sources and wherein N is at least two;

N first actuatable switching means each, when actuated, connecting said first voltage source with an associated one of said N power amplifiers;

N second actuatable switching means each, when actuated, connecting said second voltage source with an associated one of said N power amplifiers;

means for providing an input signal;

means for actuating one or more said N first switching means or one or more of said N second switching means in dependence upon the value of said input signal; and means for additively combining said amplified RF output signals to provide a combined RF output signal.

20. An RF amplifier system comprising:

first and second DC voltage sources of different magnitudes;

a RF source providing a RF drive signal;

N RF power amplifiers each for receiving said RF drive signal and providing a RF power signal amplified in accordance with the magnitude of one of said voltage sources and wherein N is at least two;

N first actuatable switching means each, when actuated, connecting said first voltage source with an associated one of said N power amplifiers;

N second actuatable switching means each, when actuated, connecting said second voltage source with an associated one of said N power amplifiers;

means for providing an input signal;

means for actuating one or more said N first switching means or one or more of said N second switching means in dependence upon the value of said input signal; and means for additively combining said amplified RF output signals to provide a combined RF output signal; and, wherein said means for providing an input signal includes means for providing a plurality of multi-bit digital words each representing a sample of a time varying analog signal.

21. A system as set forth in claim 20 wherein said means for actuating includes decoder means for decoding said digital words and, for each decoded digital word, providing control signals for controlling actuation of said power amplifiers.

22. A system as set forth in claim 20 wherein said actuating means includes decoder means having N first output circuits associated with said N first switching means and N second output circuits associated with said N second switching means for providing turn on control signals for actuating one or more of said first switching means or one or more of said second switching means.

23. A system as set forth in claim 20 including means for providing at least one fractional RF output signal having a magnitude which is a fraction of the magnitude of said first DC voltage source, said combining means being operative to additionally combine said amplified RF output signals with said at least one fractional output signal to provide said combined RF output signal.

* * * * *